(12) United States Patent
Karlov et al.

(10) Patent No.: US 6,298,321 B1
(45) Date of Patent: Oct. 2, 2001

(54) TRIE COMPRESSION USING SUBSTATES AND UTILIZING POINTERS TO REPLACE OR MERGE IDENTICAL, REORDERED STATES

(75) Inventors: Donald D. Karlov, Woodinville; Gregory N. Hullender, Kirkland; John R. Bennett, Redmond, all of WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/199,948

(22) Filed: Nov. 23, 1998

(51) Int. Cl.[7] ............ G06F 17/20; G06F 17/22
(52) U.S. Cl. ............ 704/10; 701/1; 707/101; 707/533
(58) Field of Search ............ 704/1, 8, 9, 10; 707/531, 532, 533, 3, 100, 101, 104; 341/65, 67, 95

(56) References Cited

U.S. PATENT DOCUMENTS

| | | | |
|---|---|---|---|
| 4,730,348 | * 3/1988 | MacCrisken | 375/240 |
| 4,814,746 | * 3/1989 | Miller et al. | 341/95 |
| 4,853,696 | * 8/1989 | Mukherjee | 341/65 |
| 4,959,785 | * 9/1990 | Yamamoto et al. | 707/533 |
| 5,283,894 | * 2/1994 | Deran | 707/1 |
| 5,475,588 | 12/1995 | Schabes et al. | 704/9 |
| 5,488,717 | 1/1996 | Gibson et al. | 707/2 |
| 5,488,719 | 1/1996 | Kaplan et al. | 707/100 |
| 5,532,694 | * 7/1996 | Mayers et al. | 341/67 |
| 5,592,667 | * 1/1997 | Bugajski | 707/102 |
| 5,625,554 | * 4/1997 | Cutting et al. | 707/100 |
| 5,651,099 | 7/1997 | Konsella | 706/13 |
| 5,721,899 | 2/1998 | Namba | 707/3 |
| 5,768,423 | 6/1998 | Aref et al. | 382/228 |
| 5,778,371 | * 7/1998 | Fujihara | 707/100 |
| 5,781,772 | 7/1998 | Wilkinson, III et al. | 707/3 |
| 5,799,299 | * 8/1998 | Fujiwara | 707/3 |
| 5,832,428 | 11/1998 | Chow et al. | 704/254 |
| 5,951,623 | * 9/1999 | Reynar et al. | 708/203 |
| 5,966,709 | * 10/1999 | Zhang et al. | 707/101 |
| 6,009,392 | 12/1999 | Kanevsky et al. | 704/245 |
| 6,131,102 | 10/2000 | Potter | 707/533 |
| 6,182,039 | 1/2001 | Rigazio et al. | 704/257 |
| 6,236,959 | 5/2001 | Weise | 704/9 |

FOREIGN PATENT DOCUMENTS 41-0301596A * 11/1998 (JP).

OTHER PUBLICATIONS

Knuth, Donald Ervin, "Sorting and Searching," *The Art of Computer Programming* 2nd Edition, vol. 3, Addison–Wesley, pp. 492–496, 500–502, 507–509, 512, 576, 722 (1998).

* cited by examiner

*Primary Examiner*—Joseph Thomas
(74) *Attorney, Agent, or Firm*—Michalik & Wylie, PLLC

(57) ABSTRACT

An improved trie compression method that compresses by merging partially identical subtrees. States of the trie are selected, and the nodes of those states examined find nodes that are identical to one another. The most frequently occurring identical node is selected as a substate, and the states are separated into a first group of states that have the substate node therein and a second group of states that do not. The nodes in the first group of states are reordered such that the substate is at the end thereof. Then, the substate of each state is merged into a single node, replaced by a pointer from each state. Compression is performed recursively by choosing a new substate for the remaining nodes of the first group, and for subsequently separated groups, until no further identical nodes are available for merging.

34 Claims, 11 Drawing Sheets

TRIE COMPRESSION USING SUBSTATES AND UTILIZING POINTERS TO REPLACE OR MERGE IDENTICAL, REORDERED STATES

FIELD OF THE INVENTION

The invention relates generally to computer systems, and more particularly to an improved method and system for compressing lexical data.

BACKGROUND OF THE INVENTION

A trie is a data structure that is useful for compressing lexical data such as dictionary words. Tries are composed of states, with a top-level state representing, for example, each of the first letters (e.g., a–z) of all valid words in a given dictionary. Each state is comprised of nodes, wherein each node represents a valid letter in that state, along with some information about that letter, such as a pointer to a lower state (if any). Each state represents a transition from one character in a word to the next. For example, the letter "q" in one state usually transitions to the letter "u" in a next lower state.

To use the trie, such as to find if a user-input word is a valid word in the dictionary, a search through the states is performed. For example, to find the word "the," the top-level state in the trie is searched until the "t" node is found, and then a next lower level state pointed to by the "t" node is searched to determine if there is an "h" node therein. If not, the word "the" would not be a valid word in that dictionary. However, if there is an "h" node in the state pointed to by the "t" node, the "h" node is examined to find a next state, if any. The state pointed to by the "h" node is then searched to find out whether there is an "e" node therein. If there is an "e" node, to be a valid word, the "e" node needs to be followed by some indication (e.g., a flag) indicating that a valid word exists at this time, regardless of whether the "e" node points to a further state. In a trie-structured dictionary that properly represents the English language, "the" would be a valid word, and thus the top-level state would have a "t" node, the next state pointed to by the "t" node would have an "h" node therein, and the state pointed to by that "h" node would have an "e" node therein with a valid flag set. If characters such as "thj" were searched, however, the "t" node would transition to the next state, which would have an "h" node therein, but the next state pointed to by "h" node would not include a "j" node, and thus this word would not be a valid word.

Tries are used in many types of devices, including those wherein storage space is at a premium. To save space, tries are compressed by using known compression techniques, including those that attempt to efficiently store the information in the trie. Previous compression technologies exploited similarities in both the prefixes and suffixes of words, known as head merging and tail merging, respectively. In head merging, for example, all words in a trie that begin with "ja" share the "j" of the top level state, which points to a next level state with a single "a" node therein. In tail merging, for example, all words that end with an "s" essentially end with the same information, i.e., an "s" node that is marked as terminal, and thus may share a single "s" terminal state.

While tail merging saves a significant amount of space, tail merging is limited in that only completely identical subtrees in the trie may be merged. In other words, tail merging cannot be used where subtrees are only partially the same. This limits its usefulness as a compression technique, particularly in languages such as English wherein there are many exceptions to the way words are spelled. For example, in a (limited) dictionary the words "be't'" and "we't'" may share the same endings (suffixes) of "s'," "ter'" and "ting'," where the apostrophe (') represents a valid word flag. However if "be't'" has a further suffix of "tor'" that is not shared by "we't," only the "r'" and the "ng'" endings may be merged via tail compression. In sum, even though the subtrees are nearly identical, only the parts thereof that are actually identical may be shared in tail compression.

SUMMARY OF THE INVENTION

Briefly, the present invention provides an improved trie compression method using substate compression such that partially identical subtrees may be merged to some extent. To this end, states of the trie are selected, and the nodes of those states examined find nodes that are identical to one another. The most frequently occurring identical node is selected as a substate, and the states are separated into a first group of states that have the substate node therein and a second group of states that do not. The nodes in the first group of states are reordered such that the substate is at the end thereof. Then, the substate of each state is merged into a single node, and the node preceding the substate node provided with a right pointer thereto. The substate compression is performed recursively on the remaining nodes of the first group, and on the second group, i.e., a new most frequent node is selected as the substate, which is then merged, until no further identical nodes are available for merging. Essentially, compression is achieved by replacing identical nodes with pointers thereto.

Other advantages will become apparent from the following detailed description when taken in conjunction with the drawings, in which:

DETAILED DESCRIPTION OF THE PREFERRED EMBODIMENT

Exemplary Operating Environment

Figure 1:
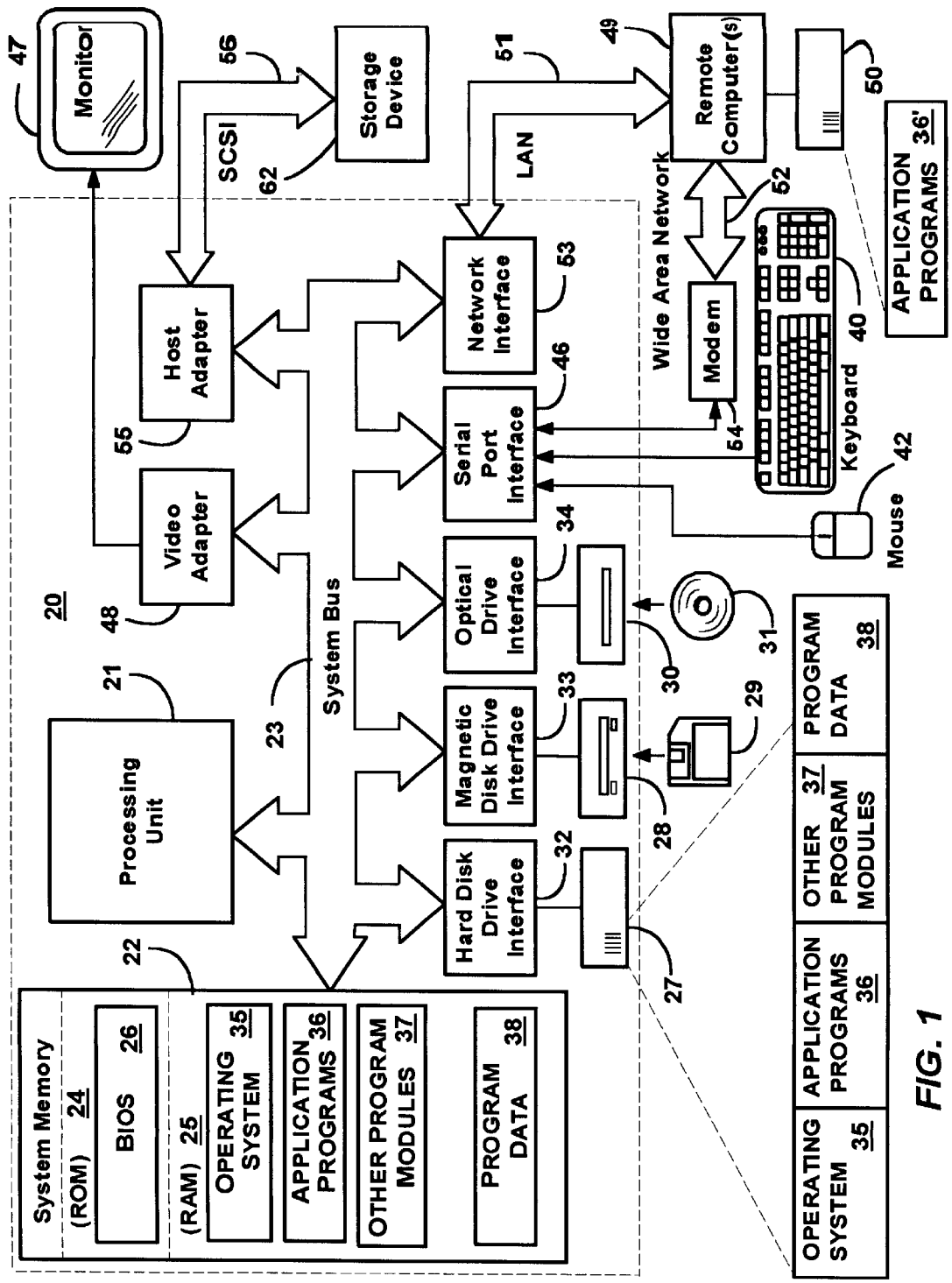
FIG. 1 is a block diagram representing a computer system into which the present invention may be incorporated.

FIG. 1 and the following discussion are intended to provide a brief general description of a suitable computing environment in which the invention may be implemented. Although not required, the invention will be described in the general context of computer-executable instructions, such as program modules, being executed by a personal computer. Generally, program modules include routines, programs, objects, components, data structures and the like that perform particular tasks or implement particular abstract data types. Moreover, those skilled in the art will appreciate that the invention may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

With reference to FIG. 1, an exemplary system for implementing the invention includes a general purpose computing device in the form of a conventional personal computer 20 or the like, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read-only memory (ROM) 24 and random access memory (RAM) 25. A basic input/output system 26 (BIOS), containing the basic routines that help to transfer information between elements within the personal computer 20, such as during start-up, is stored in ROM 24. The personal computer 20 may further include a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD-ROM or other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide non-volatile storage of computer readable instructions, data structures, program modules and other data for the personal computer 20. Although the exemplary environment described herein employs a hard disk, a removable magnetic disk 29 and a removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read-only memories (ROMs) and the like may also be used in the exemplary operating environment.

A number of program modules may be stored on the hard disk, magnetic disk 29, optical disk 31, ROM 24 or RAM 25, including an operating system 35, one or more application programs 36, other program modules 37 and program data 38. A user may enter commands and information into the personal computer 20 through input devices such as a keyboard 40 and pointing device 42. Other input devices (not shown) may include a microphone, joystick, game pad, satellite dish, scanner or the like. These and other input devices are often connected to the processing unit 21 through a serial port interface 46 that is coupled to the system bus, but may be connected by other interfaces, such as a parallel port, game port or universal serial bus (USB). A monitor 47 or other type of display device is also connected to the system bus 23 via an interface, such as a video adapter 48. In addition to the monitor 47, personal computers typically include other peripheral output devices (not shown), such as speakers and printers.

The personal computer 20 may operate in a networked environment using logical connections to one or more remote computers, such as a remote computer 49. The remote computer 49 may be another personal computer, a server, a router, a network PC, a peer device or other common network node, and typically includes many or all of the elements described above relative to the personal computer 20, although only a memory storage device 50 has been illustrated in FIG. 1. The logical connections depicted in FIG. 1 include a local area network (LAN) 51 and a wide area network (WAN) 52. Such networking environments are commonplace in offices, enterprise-wide computer networks, Intranets and the Internet.

When used in a LAN networking environment, the personal computer 20 is connected to the local network 51 through a network interface or adapter 53. When used in a WAN networking environment, the personal computer 20 typically includes a modem 54 or other means for establishing communications over the wide area network 52, such as the Internet. The modem 54, which may be internal or external, is connected to the system bus 23 via the serial part interface 46. In a networked environment, program modules depicted relative to the personal computer 20, or portions thereof, may be stored in the remote memory storage device. It will be appreciated that the network connections shown are exemplary and other means of establishing a communications link between the computers may be used.

Trie Compression

Figure 2:
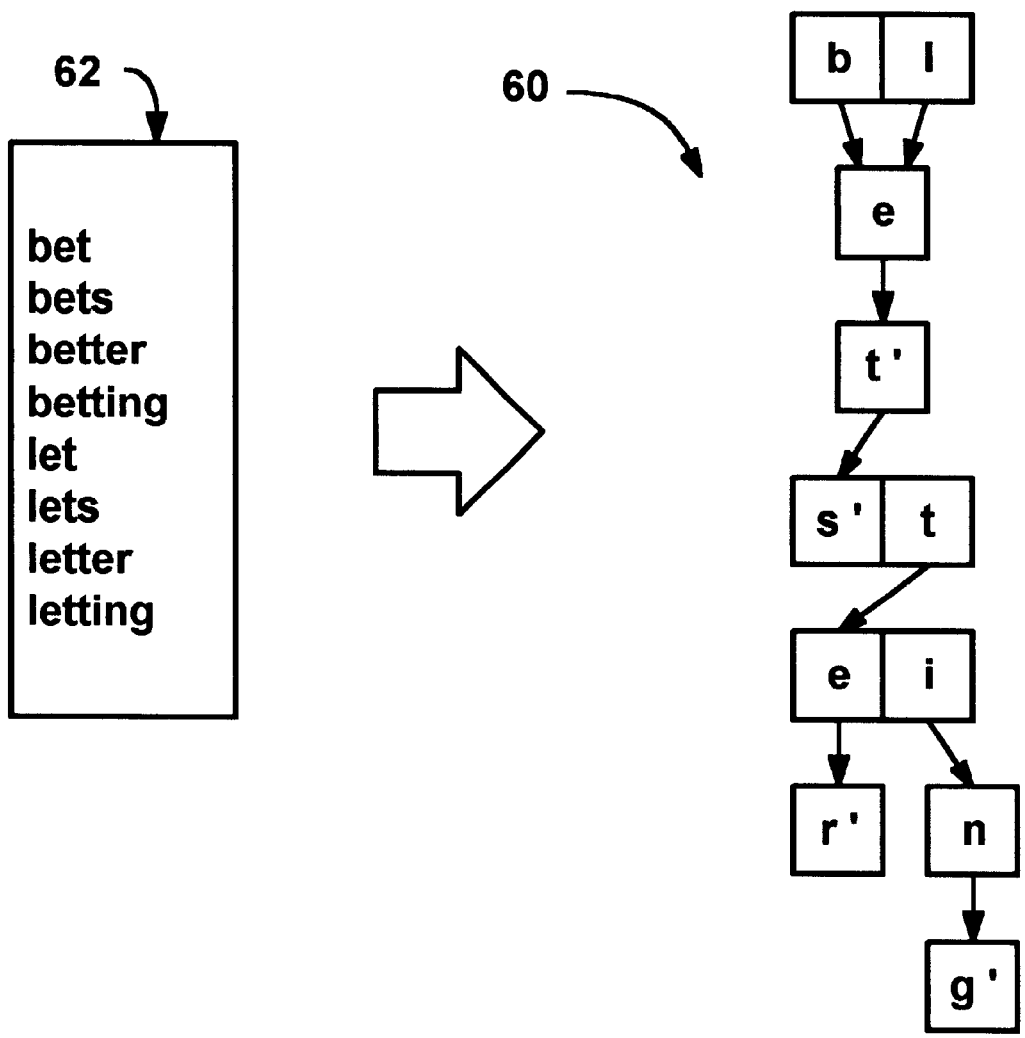
FIGS. 2 and 3 are examples of trie-structured dictionaries for small word lists according to the prior art.

By way of background, FIG. 2 shows a trie-structured dictionary 60 according to the prior art that stores a small list 62 of eight words. In FIG. 2, the nodes are shown as boxes surrounding a character, while the states are shown as groups of one or more nodes, wherein if more than one node is in a state, the boxes representing the nodes of that state are shown in contact with one another. Transitions from a node to a next state are pointers, shown as arrows between nodes and lower-level states in FIG. 2. Also, in FIG. 2, nodes that end a valid word are indicated by an apostrophe (') representing a "valid" flag that is set to indicate when a valid word exists. As can be seen, head merging and tail merging have been performed on the words in the list 60 to provide a highly compact trie.

In FIG. 2, the top-level state comprises "b" and "l" nodes, representing the characters that can start a word in this dictionary. Each of those nodes transitions to a lower "e" state representing the next character in the valid words. For example, to find if the word a "bet" is valid in the dictionary, the top-level state is first searched to find if "b" is a valid start of a word. The "b" node transitions to another state having an "e" node therein, and thus a search of this next state indicates that the "b" node is followed by an "e" node, so the word "bet" is still possibly valid. The "e" note transitions to another state having a "t'" node therein, (where the apostrophe indicates that the "t" completes a valid word), and thus a search of this state indicates that "bet" is a valid word.

Figure 3:
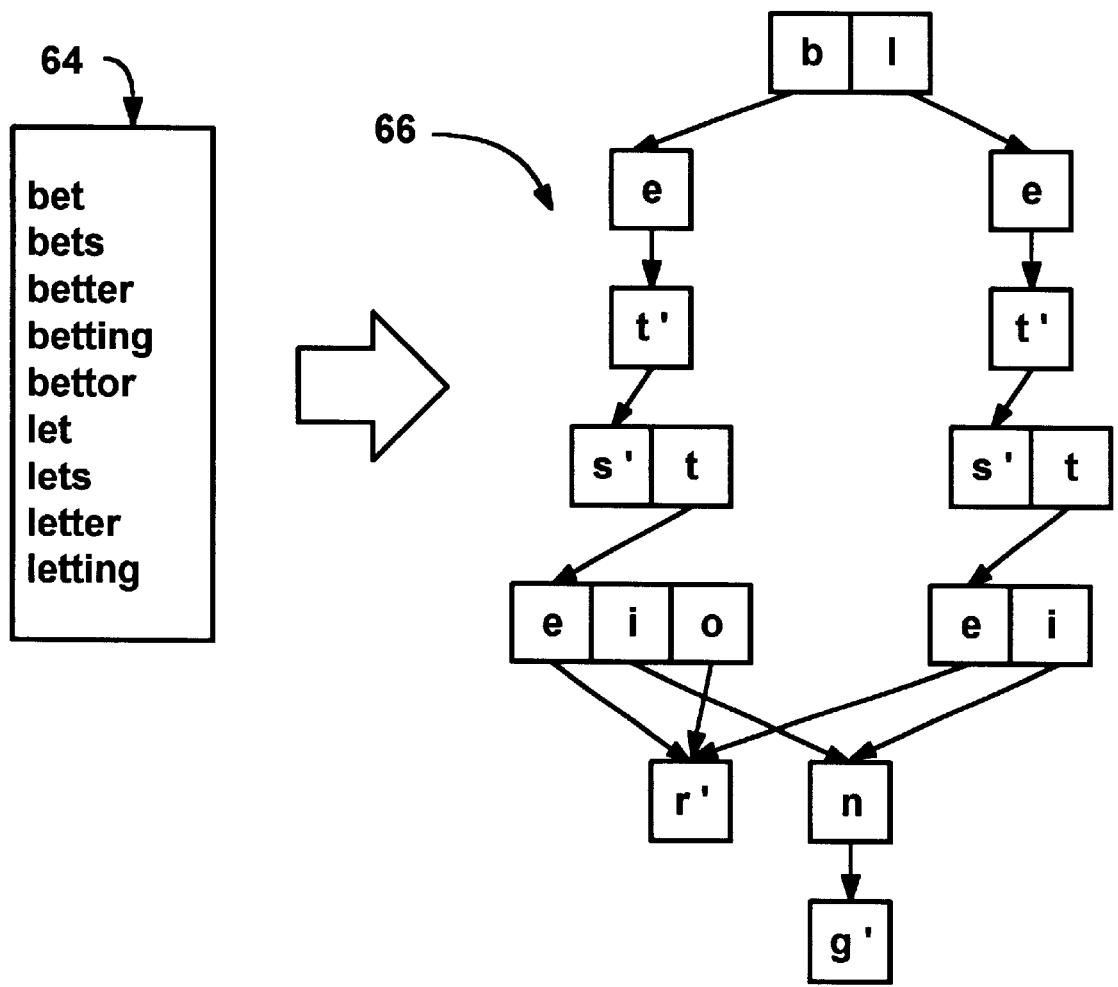

However, consider if the word "bettor" was in a similar list 64 as shown in FIG. 3. To accommodate this word, a state of "e," "i" and "o" nodes is needed three states below the "b" node in the top-level state. However, there is no such word "lettor," and thus despite their similarities, the lower level states are not identical and cannot be shared until the lowermost "e" nodes again converge on the "r" node and the "i" nodes again converge on the "n" node. As can be seen in the example of FIG. 3, tail merging is often rather limited in its ability to reduce the number of nodes.

Figure 4:
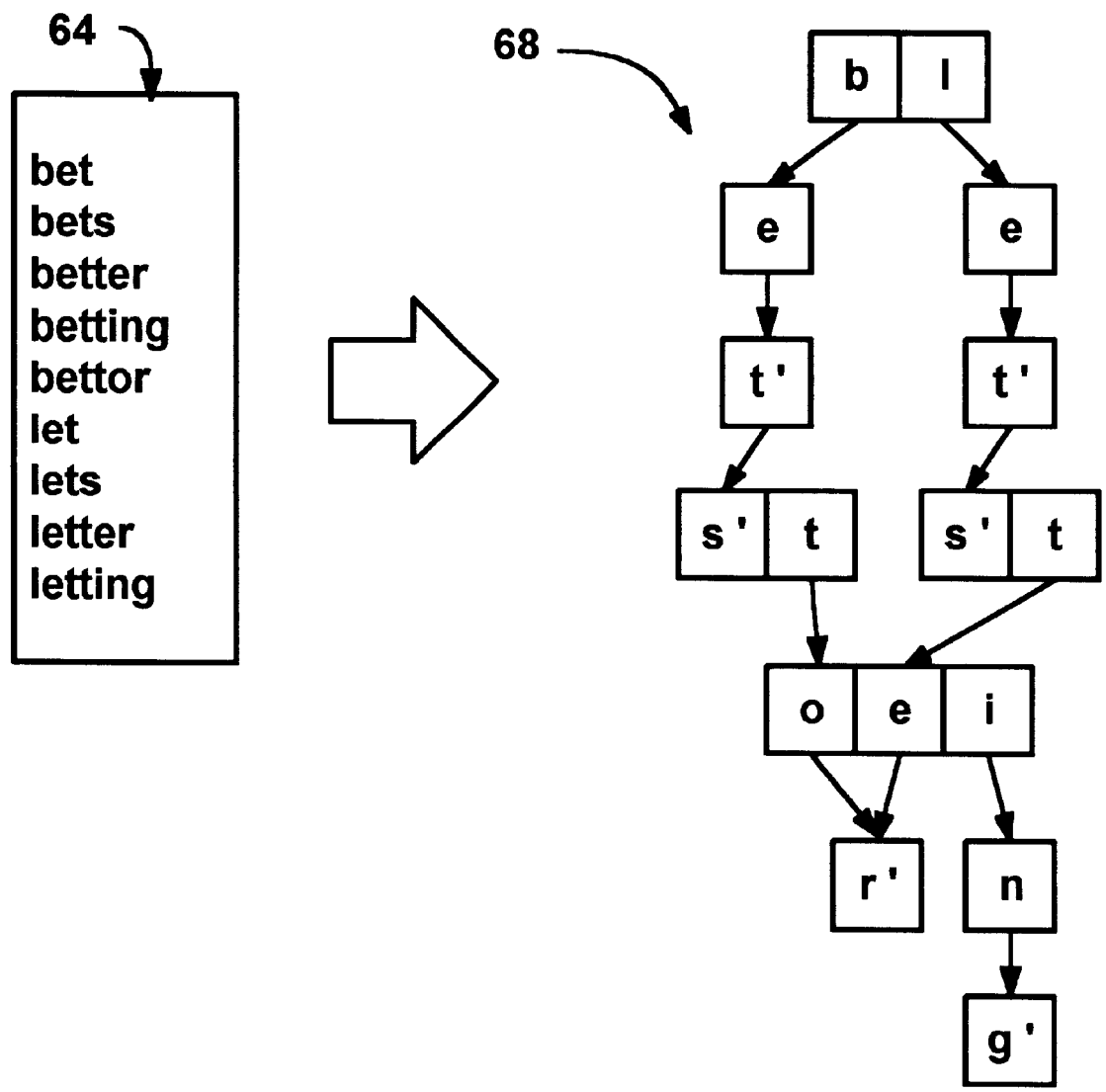
FIG. 4 is an example of a trie-structured dictionary for a small list of words with improved compression.

FIG. 4 shows a compression improvement to FIG. 3, in that the nodes in the "eio" state of a trie 68 have been reordered as "oei," and the "t" node under the "l" node points into the middle of this state. To this end, when a state (e.g., "ei") is a strict subset of another state (e.g., "eio"), this condition is detected and the larger set of nodes is reordered with the subset at the end thereof. The higher level node that transitions to this subset state has its down pointer set to point into the larger set of nodes at the beginning of this subset. Note that the "eio" state is essentially unchanged when reordered as "oei," since the order of nodes in a state is irrelevant with respect to whether a particular node will be found when searched in a linear manner.

Figure 5:
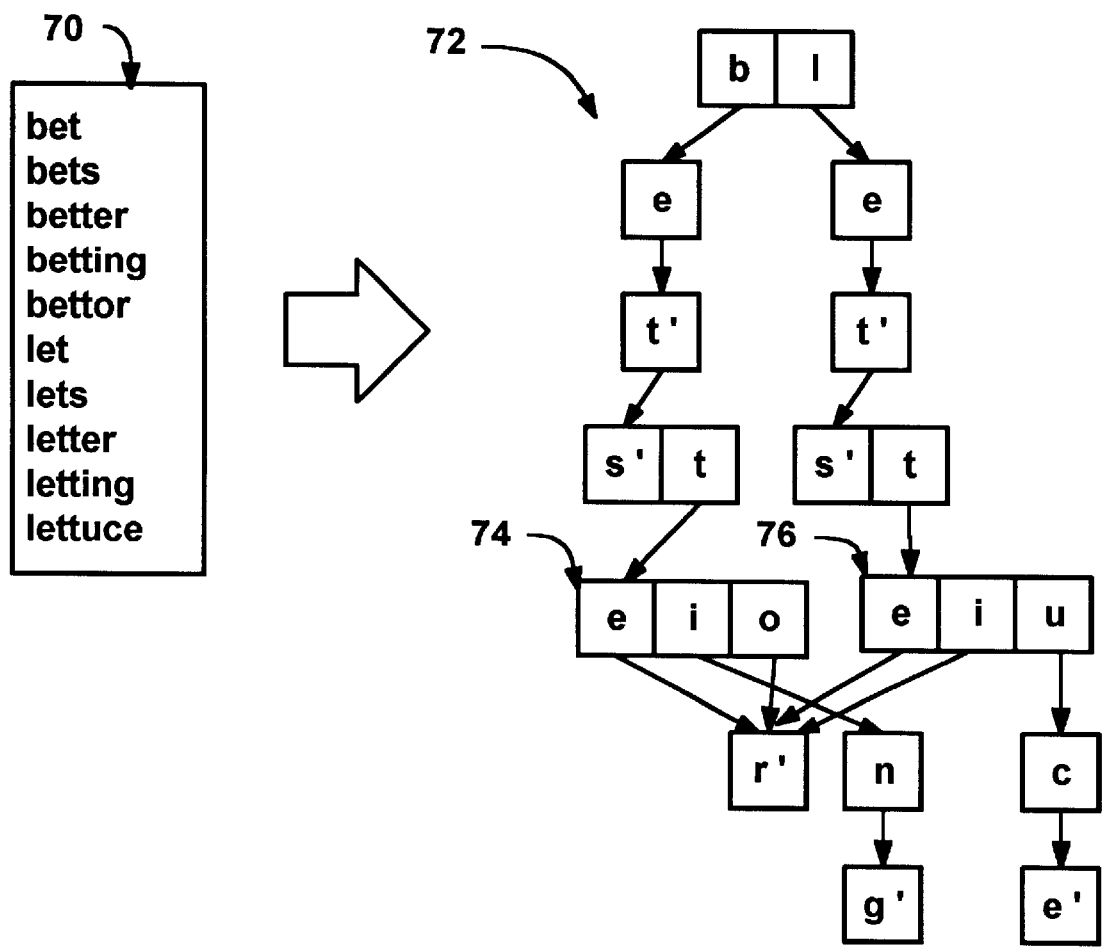
FIG. 5 is a representation of a trie-structured dictionary for a small list of words prior to improved compression of the present invention.

This compression improvement is limited to strict subsets, however, and fails, for example, when a different list 70 with an additional word breaks the strict subset as shown in the trie 72 of FIG. 5. In FIG. 5, two states 74 and 76 are now needed to properly represent the work list 70, but neither is a subset of the other. As a result, this technique of compression via subsets is also rather limited.

Substate Compression

Figure 9:
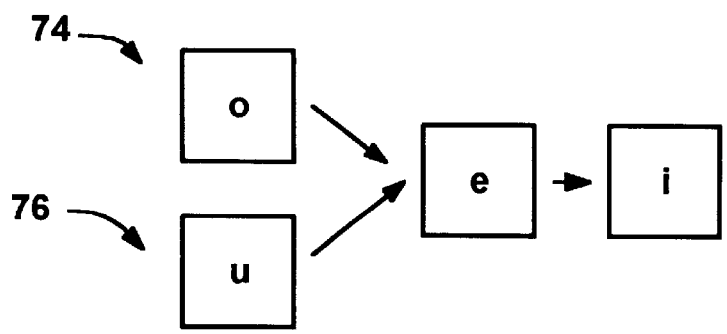
Figure 10:
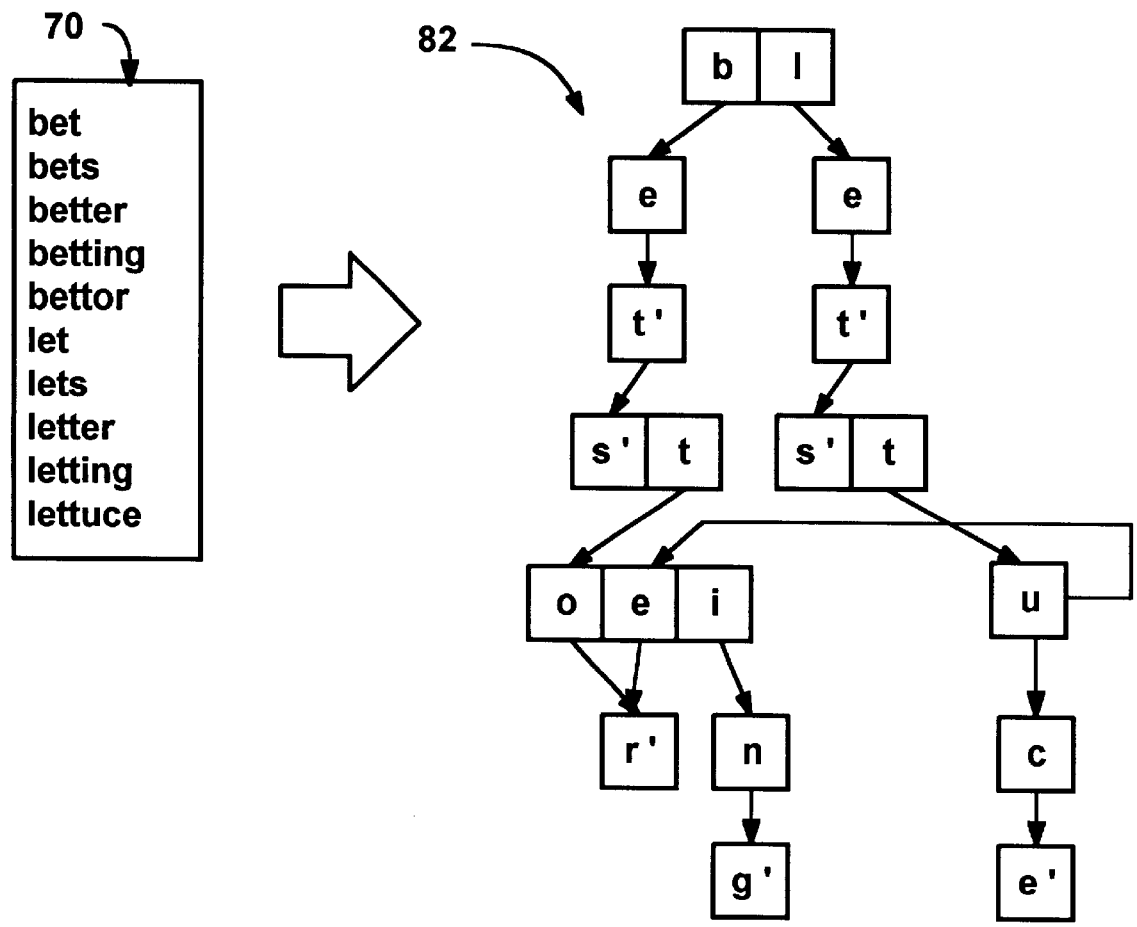
FIG. 10 is a representation of the trie-structured dictionary of FIG. 5 after having been compressed via substate compression in accordance with one aspect of the present invention.

In accordance with one aspect of the present invention, substate compression is able to compress the trie of FIG. 5 to a greater extent than the prior art compression techniques. FIGS. 6–9 generally show the concept of substate compression, while FIG. 10 shows the result thereof with respect to the word list 70.

Figure 6:
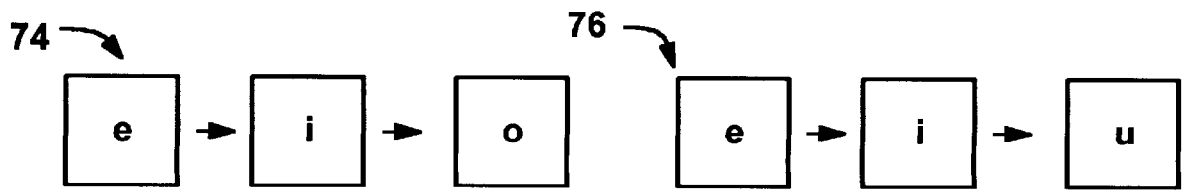
FIGS. 6–9 are representations of two states in FIG. 5 being modified via substate compression in accordance with one aspect of the present invention.
Figure 7:
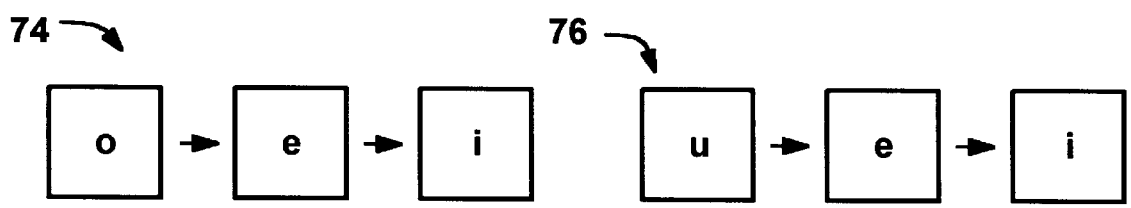

In FIG. 6, only the nodes of the similar states 74 and 76 will be considered, although, as described in more detail below, ordinarily all of the nodes of a trie are initially grouped together. In any event, as shown in FIG. 7, the states are reordered (if necessary) such that the most frequently occurring nodes among those states that are identical to one another are at the end of the states 74, 76. Note that identical nodes have the same character identifiers, as well as the same pointers, (e.g., down pointers to the next state), and the same flags. However, the terminal flag is ignored when determining if nodes are identical, since, as described above, the node is the last in a state depends on the order of nodes in the state, which is not relevant herein. Indeed, what serves as the last node in a state may be regularly changed. Thus, as used herein, "identical nodes" refer to nodes that match with respect to their identifiers, certain flags and pointers, rather than requiring an exact match.

In the present example, the "e" nodes are identical, as are the "i" nodes, and both occur twice (once in each state). Since they have the same frequency, one is selected, e.g., the "i" node, and the states 74 and 76 are re-ordered as shown in FIG. 7 with the "i" node at the ends thereof. Note that in general, selecting one node over the other may result in improved compression, and indeed, selecting a node that is not the most frequent may also result in improved compression. However, there is no reasonable way to predict which one will result in better compression, and indeed, finding and trying all possible substates in an actual trie is believed to be an NP complete problem. However, one extension to the present invention is to try a few alternates and empirically determine what works best.

In any event, the present invention thus provides substantial compression benefits in a reasonable amount of time by selecting the most frequent node, and employing some tie-breaking mechanism when needed, for example, by selecting one at random in the case of a tie. Note that the tie-breaking mechanism may be tailored to specific circumstances, such as a French language tie-breaker, German language tie-breaker and so on.

Figure 8:
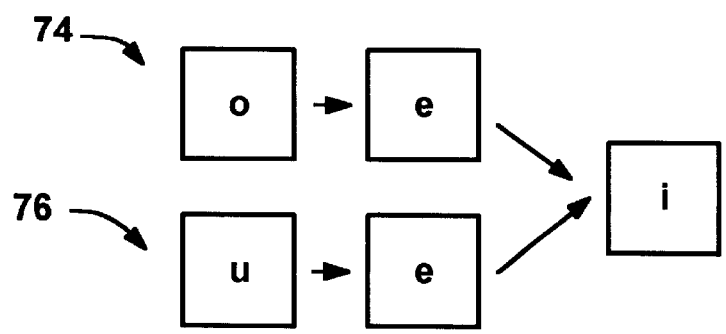

Once reordered, the "i" nodes are merged into a single node as shown in FIG. 8, essentially by removing all but one of the "i" nodes and placing a right pointer to the remaining "i" node into each of the "e" nodes. In other words, the "i" node becomes the substate. Note that for efficiency, a threshold number of nodes to merge may be required, e.g., do not select the identical nodes for merging unless at least five exist among the various states. Once merged, the process is repeated as necessary, i.e., the states are reordered (as needed) with the next most frequent identical nodes (the "e" nodes with pointers to the "i" nodes) at the end thereof, and the "e" nodes merged as shown in FIG. 9.

FIG. 10 shows the result of the substate compression in a trie 82. In FIG. 10, the "i" node is immediately after the "e" node in the "oei" state, eliminating the need for a right pointer thereto. The "u" node has a right pointer to the "e" node, thus providing a "uei" state. As can be seen, approximately ten-percent compression results in this small word list. In dictionaries of real size for languages such as English and German, compression improvements ranging from approximately ten to twenty-five percent have resulted from substate compression.

Figure 11:
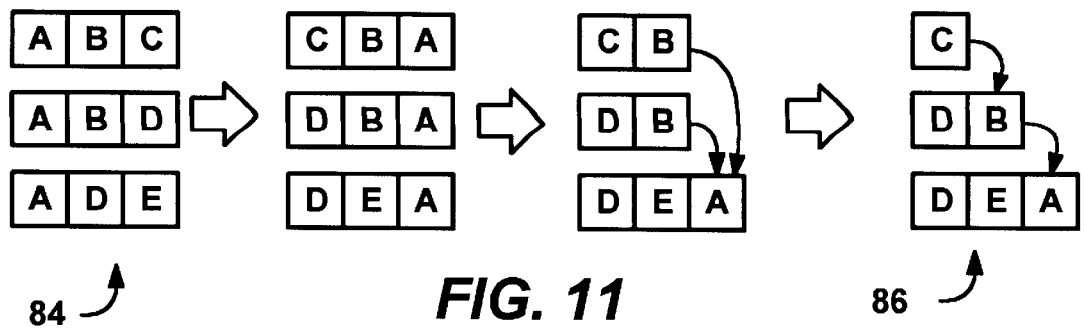
FIGS. 11–14 are representations of strings of nodes in states being compressed via substate compression in accordance with one aspect of the present invention.

FIGS. 11–14 similarly show the concept of substate compression. However, in FIGS. 11–14, substate compression is shown as compressing strings of one or more nodes, represented by capital letters. In FIG. 11, the arrows indicate the transformation of the states over time as substate compression is applied thereto. First, the states are reordered with the most frequent string of nodes (the "A" string) at the end of each state, then the three "A" strings are merged into one "A" string via right pointers thereto. Essentially, what is being generated is a directed graph, although some of the right pointers may be implicit, i.e., when a node immediately follows a preceding node, it has an implicit right pointer thereto rather than having an actual right pointer thereto. Next, after reordering (if needed) to place the next most frequent node strings at the end, (i.e., the two "B" strings), those node strings are merged into one "B" string of nodes having right pointers thereto, resulting in the substate compressed structure 86.

Figure 12:
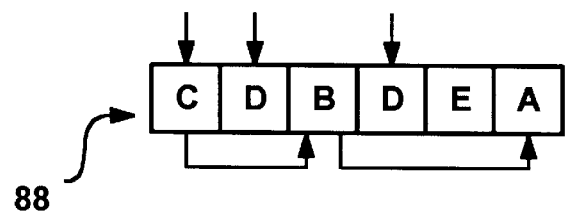

FIG. 12 shows that in general, substate compression leaves the states (of strings of nodes) unchanged, other than that the states are re-ordered. In FIG. 12, the node strings are shown as stored in a linear array 88, to emphasize their equivalence to the node strings 84 of FIG. 11. In FIG. 12, the vertical arrows down indicate where down pointers from higher level states are pointing, while the mostly horizontal arrows represent the right pointers. As shown in FIG. 12, a first higher level state points down to a "CBA" state, a second higher level state points to a "DBA" state, and a third higher level pointer points to a DEA state. As can be appreciated, this is essentially the same as pointing to the "ABC," "ABD" and "ADE" states 84, respectively, of FIG. 11.

Figure 13:
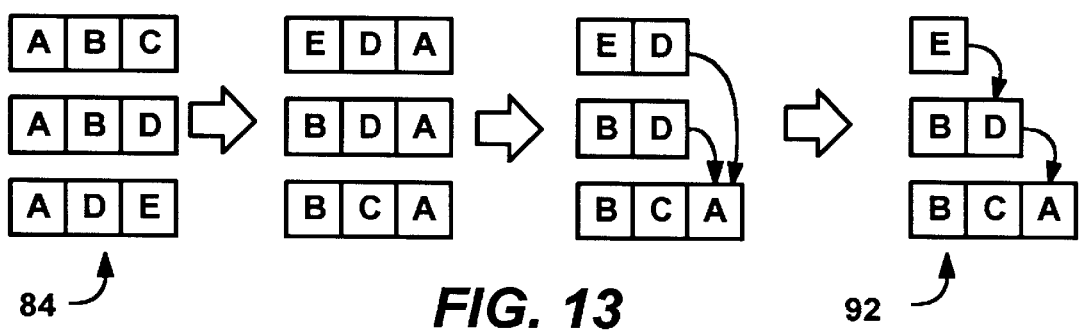
Figure 14:
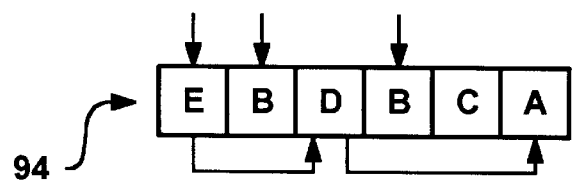

FIGS. 13 and 14 generally show the same substate compression, except that the node strings are shown in a different arrangement. Note that two "B" strings of nodes result in the array 92 (FIG. 13)/linear array 94 (FIG. 14), in contrast to the two "D" node strings in FIGS. 11 or 12. Nevertheless, as long as the down pointers from nodes of higher level states still point to the proper respective states of node strings, the result is the same. Thus an "EDA" state, "BDA" state and "BCA" state of node strings are pointed to by those higher level nodes. However, instead of nine strings of nodes, only six strings and two pointers are needed due to substate compression.

Figure 15:
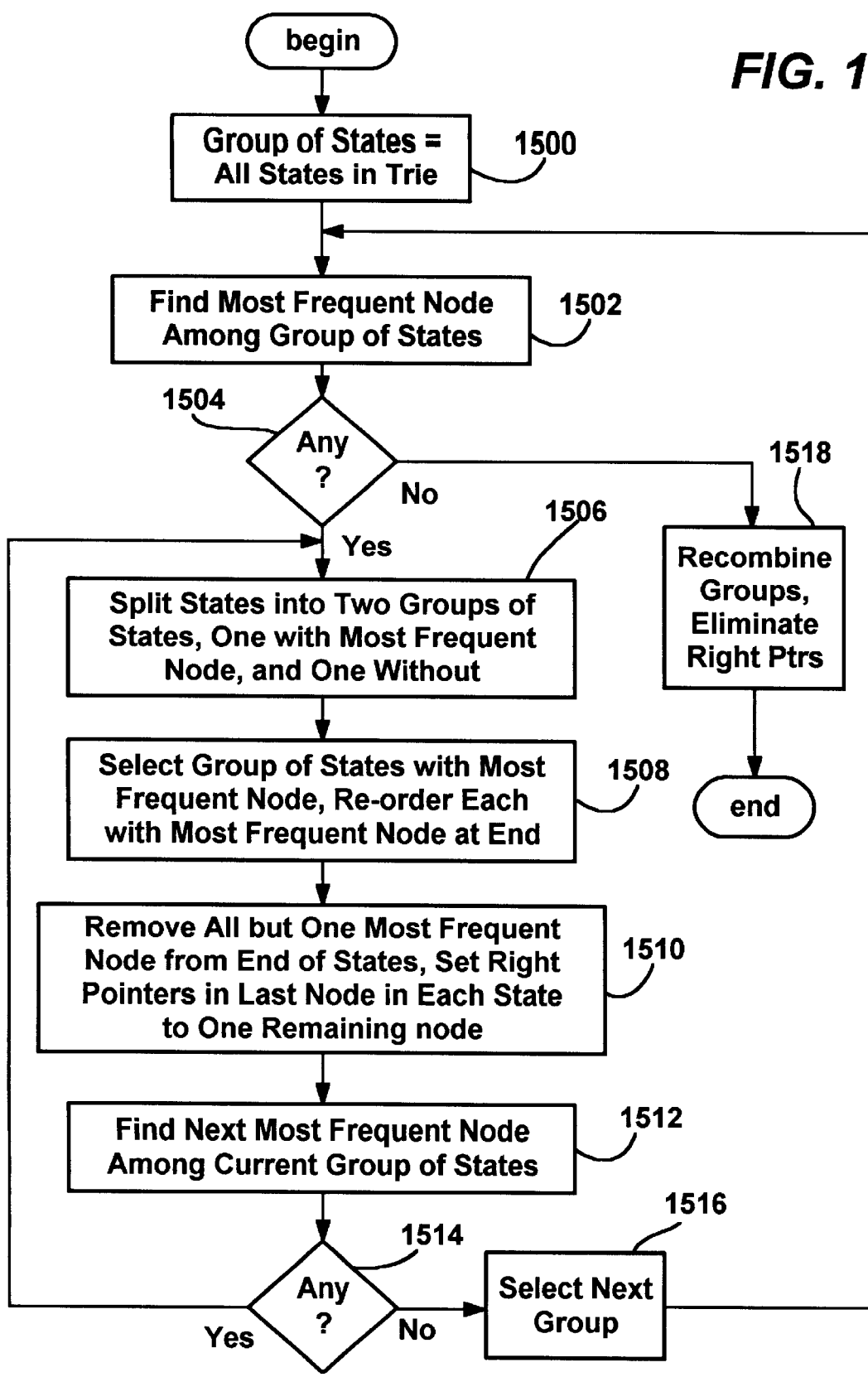
FIG. 15 is a flow diagram generally representing the steps taken to perform substate compression in accordance with one aspect of the present invention.
Figure 16:
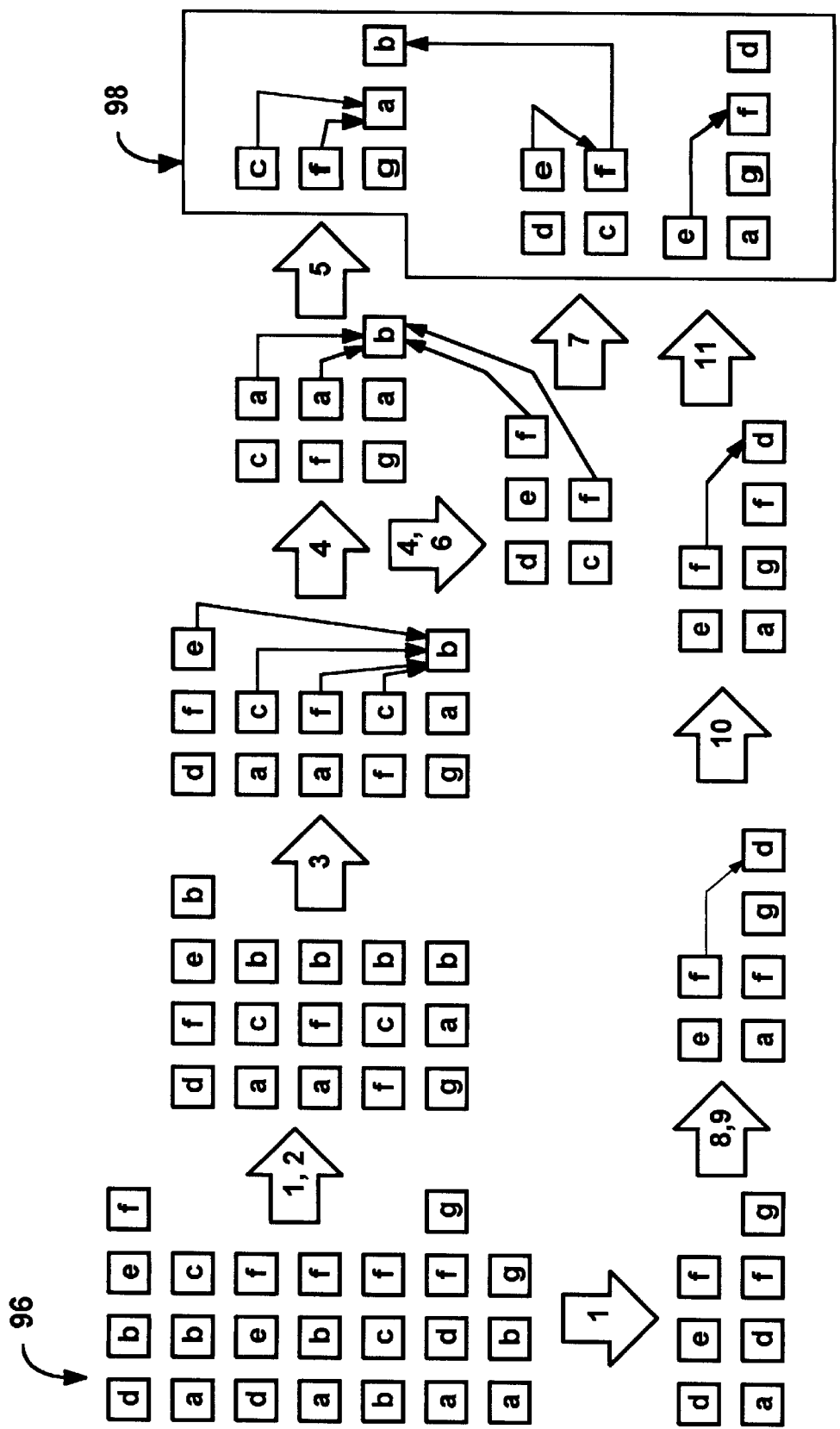
FIG. 16 is representation of states of nodes undergoing substate compression via the steps of FIG. 15.
Figure 17:
FIGS. 17–20 are representations of two states in FIG. 4 being modified via substate compression, wherein one state is a strict subset of the other.
Figure 18:
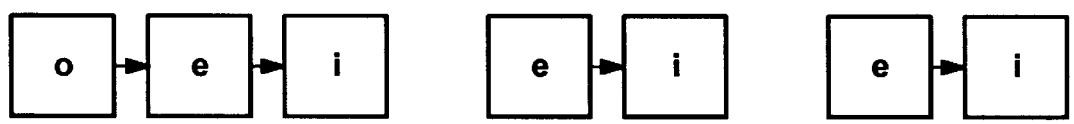
Figure 19:
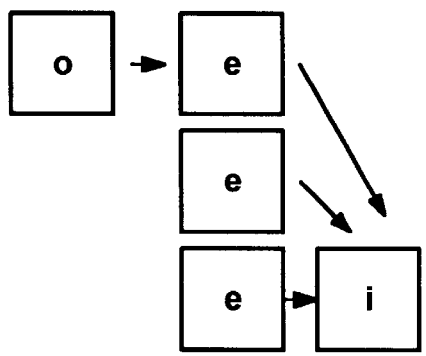
Figure 20:
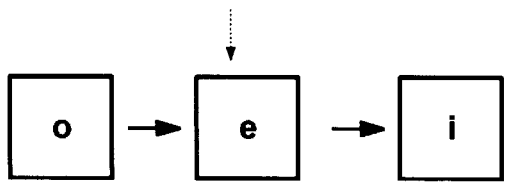

In accordance with one aspect of the present invention, there is provided an algorithm that finds most of the substates in a trie in a reasonable amount of time. To this end, FIG. 15 generally shows the steps taken to perform relatively rapid substate compression on a trie of states, while FIG. 16 shows how a small number of nodes is compressed as the steps of FIG. 15 take place. At step 1500, a group of states is selected that includes all of the states in the trie that is to undergo compression. Of course, a smaller group may be selected, such as if a particular state was to be left intact for a particular reason. At step 1502, the most frequent node among the current group of states is determined. To this end, a list of states is generated, and the nodes in those states placed into an array. The array is then sorted such that nodes with identical characteristics (identifier, pointers and flags other than the terminal flag) are grouped together. Such sorting by criteria is well known, and is not described in detail herein. Counts of identical nodes are then made, and the highest count is the most frequent node. A tie-breaking procedure or the like is used if two or more nodes are equally frequent. Step 1504 tests if there is at least one most frequent identical node, i.e., at least two nodes were identical, which is highly likely initially, although as will be understood, eventually there are no such identical nodes remaining to merge. Note that step 1504 may compare the count against a threshold value to determine if some minimum number of identical nodes are present for merging, for purposes of efficiency.

For purposes of this description, assume that at this time that the threshold requires only two for merging, and that there is at least one pair of identical nodes, such that step 1504 branches to step 1506. At step 1506, the states are split into two groups, a group of states that has the most frequent node therein, and a group that does not. By way of example, FIG. 16 shows a trie of states 96 as they are being processed by the steps of FIG. 15. As shown in FIG. 16, the "b" node is selected as the most frequent node, as it occurs five times. Note that the "f" node also occurs five times, but some tie-breaking technique has selected the "b" node, as described above. Then, as shown by the downwardly directed arrow marked (1) and the right arrow marked (1 and also 2), the states are split into states that include the "b" node and those that do not.

At step 1508, the states having the most frequent node are reordered such that the most frequent node is at the end of each state. In FIG. 16, those states that have the "b" node are reordered in this manner, represented by the "2" of the (1, 2) arrow. Next, at step 1510, all but one of the end nodes are removed from these states, and the nodes prior to the removed node given a right pointer to the one remaining node, the substate, shown via the right arrow numbered (3). Thus, as shown in FIG. 16, one "b" node remains as the substate, which is pointed to by the last remaining node in each of the other states.

At step 1512, the next most frequent node in each state is found, and via step 1514, loops back to step 1506 to repeat the process on this next most frequent node until no identical nodes are found. The algorithm thus recursively operates to compress the states until no identical nodes exist in the current group of states. As shown in FIG. 16 by arrows numbered (4) and (5), the states with the most frequent node (those with one of the three "a" nodes, selected by a tiebreaker over those with one of the three "f" nodes) are grouped together. The "a" nodes are then placed on the end of those states and merged into a single node as described above, effectively becoming an "ab" substate. Note that the "b" substate is a substate of the "ab" substate.

Ultimately, step 1514 finds that there are no more identical nodes in the current group of states, e.g., the threshold of two is not achieved in this group. At this time, the other groups (those that were split off for not having a most frequent node therein) are processed in the same manner. As shown in FIG. 16, the "dfe" state and "fc" state, each with a pointer to the "b" node, are one such group, split off as shown via the "4" part of the down arrow numbered (4, 6). The states are rearranged with the identical "f" nodes at the end as shown by the "6" part of the (4, 6) arrow, since after rearranging, both have the same right pointer to a "b" node. These "f" nodes are then merged, as shown by the right arrow numbered (7).

A "def" and "adfg" state were also grouped together, and are thus next processed as described above, resulting in additional substate compression, i.e., the "e" node ultimately points to the "f" node of the "agfd" state as shown via numbered arrows (8, 9) through (11). Lastly, when no more states remain that have nodes that are identical to nodes in other states, the groups are recombined into the trie 98 via step 1518. A search may be performed so that any right pointers that point to nodes immediately to the right thereof are removed, since a node which precedes another in this type of trie structure has an implicit right pointer thereto.

Note that it is possible for an entire state to be consumed by substate compression, e.g., when one state is a strict subset of another. Frequently this may be avoided by having the node of the state that would be consumed be the substate, whereby the other nodes point to that node and one node of that state would remain. For example, when substate compressing the trie of FIG. 3, the right "i" node is chosen as the substate, then the right "e" node, and when the right pointers are eliminated due to the nodes being consecutive, the resulting trie is that shown in FIG. 4.

However, as shown in FIGS. 17–20, it is not always possible to preserve a state by selecting its one node as the substate, such as when two or more states have nothing but the identical node remaining, and/or when strict subsets are nested, i.e., one may be consumed by another which is then consumed by another and so on. When an entire state is consumed, the substate node is marked as having a down pointer thereto, which may cause a restart in some optional algorithms.

Lastly, although the present invention has been described with respect to selecting one common node (e.g., the most frequent) among the states as the identical node, it is feasible to look for two or more nodes that are common within each of the states and pull such multiple nodes off together. For example, "a" and "e" nodes may be common in many states, and thus may be pulled off together from the group of states having those nodes in common, and replaced with right pointers from each of those states to that "ae" substate.

As can be seen from the foregoing detailed description, there is provided improved trie compression using substates to merge partially identical subtrees and thereby provide additional compression. An algorithm is provided to locate and merge substates in a reasonable time.

While the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention.

What is claimed is:

1. A computer-implemented method for compressing a trie, comprising, selecting a group of states, each state having at least one node string therein that is identical to a node string in each other state in the group, selecting a node string that is identical in each state in the group as an identical node string, ordering each state in the group so that the identical node string is at the end thereof, and reducing the number of identical node strings by replacing the identical node string of at least one of the states with a pointer from another node string therein to the identical node string of another state.

2. The method of claim 1 wherein selecting a group of states comprises, selecting a set of states in a trie, examining the node strings in the set of states to find node strings that are identical to one another, evaluating the node strings that are identical to one another to find a common node string of the set of states, and choosing as the group of states the states that have the common node string therein.

3. The method of claim 2 wherein the common node string comprises a most frequent node string of the set of states.

4. The method of claim 2 wherein the set of states comprises all of the states in the trie.

5. The method of claim 2 wherein evaluating the node strings that are identical to one another comprises sorting the node strings.

6. The method of claim 1 wherein selecting a node string that is identical in each state in the group comprises selecting a most frequent node strings the identical node string.

7. The method of claim 6 further comprising, evaluating the node strings that are identical to one another to find another most frequent node string of the group of states after replacing the identical node string, selecting the next most frequent node string as a new identical node string, ordering each state in the group so that the new identical node string is at the end thereof, and reducing the number of node strings by replacing the new identical node string of at least one of the states with a pointer from another node string therein to the new identical node string of another state.

8. The method of claim 6 further comprising the steps of:
(a) evaluating the node strings that are identical to one another to find another most frequent node string of the group of states and a count thereof; and
(b) if the count achieves a threshold value,
(i) selecting the most frequent node found in the step (a) as a new identical node string;
(ii) ordering each state in the group so that the new identical node string is at the end thereof;
(iii) reducing the number of node strings by replacing the new identical node string of at least one of the states with a pointer from another node string therein to the new identical node string of another state; and
(iv) repeating steps (a)–(b) until the count does not achieve the threshold value.

9. The method of claim 8 wherein the threshold value is five.

10. The method of claim 8 wherein the threshold value is two.

11. The method of claim 1 wherein the identical node string is a sole node string in a state, and wherein the sole node string is selected as the identical node string of the other state for pointing thereto.

12. The method of claim 1 wherein a state in the group has only the identical node string therein, and further comprising, eliminating the node string of that state, and marking the identical node string of another state as having a down pointer thereto.

13. A computer-readable medium having computer-executable instructions for performing the method of claim 1.

14. The method of claim 1 wherein each node string comprises a single node.

15. The method of claim 1 wherein each node string represents a single character.

16. A computer-implemented method for compressing a trie, comprising, selecting a group of states of the trie, each state having a node string therein that is identical to a node string in each other state in the group, selecting a node string that is identical in each state in the group as an identical node string, ordering each state in the group so that the identical node string is at the end thereof following a preceding node string, reducing the number of node strings by merging the identical node strings into a single node string, and pointing to that node string from the preceding node string of each of the other states.

17. The method of claim 16 wherein selecting a group of states comprises, selecting a set of states in a trie, examining the node strings in the set of states to find node strings that are identical to one another, evaluating the node strings that are identical to one another to and a common node string of the set of states, and choosing as the group of states the states that have the most common therein.

18. The method of claim 16 wherein the single node string is at the end of one of the states and the preceding node string of that state has an implicit right pointer thereto.

19. The method of claim 16 further comprising evaluating the node strings that are identical to one another to find a most frequent node string of the set of states.

20. The method of claim 19 wherein evaluating the node strings that are identical to one another comprises sorting the node strings.

21. The method of claim 19 wherein selecting a node string that is identical in each state in the group comprises selecting the most frequent node string as the identical node string.

22. The method of claim 21 further comprising:
(a) evaluating the node strings that are identical to one another to find another most frequent node string of the group of states after merging the identical node string;
(b) selecting the most frequent node string as a new identical node string;
(c) ordering each state in the group so that the new identical node string is at the end thereof following a preceding node string;
(d) reducing the number of node strings by merging the new identical node strings into another single node string;
(e) pointing to the other single node string from the preceding node string of each of the other states; and
(f) repeating steps (a)–(e) at least one additional time.

23. The method of claim 22 wherein the other single node string is at the end of one of the states and the preceding node string of that state has an implicit right pointer thereto.

24. The method of claim 16 further comprising marking the single node string as having a down pointer thereto.

25. A computer-readable medium having computer-executable instructions for performing the method of claim 16.

26. A computer-implemented method for compressing a trie, comprising, selecting a plurality of states of the trie, examining the node strings in the states to find node strings that are identical to one another, evaluating the node strings that are identical to one another to find a most frequent node string of the states as a selected node string, separating the states in a first group of states that have the selected node string therein and a second group of states that do not have the selected node string therein, ordering each state in the first group so that the selected node string is at the end thereof, reducing the number of node strings by merging the selected node string in each state into a single node string, and pointing, to the single node string from a node string in each of the other states.

27. The method of claim 26 further comprising, examining the node strings in the second group of states to find node strings that are identical to one another, evaluating the node strings that are identical to one another to find a most frequent node string in the second group of states as another selected node string, separating the states into a third group of states that have the other selected node string therein and a fourth group of states that do not have the other selected node string therein, ordering each state in the third group so that the other selected node string is at the end thereof, reducing the number of node strings by merging the most frequent node string in the second group in each state in the third group into a single node string, and pointing to the single node string from a node string in each of the other states.

28. A computer-readable medium having computer-executable instructions for performing the method of claim 26.

29. A computer-implemented method for compressing a trie, comprising:

(a) evaluating the node strings in a group of states to find node strings therein that are identical to one another;

(b) selecting a node string that is identical to at least one other node string as a current identical node string;

(c) ordering at least two of the states in the group so that the current identical node string and at least one node string identical thereto are each at the end of their respective state;

(d) reducing the number of identical node strings by replacing the identical node string at the end of at least one of the states with a pointer to the current identical node string; and (e) repeating steps (a)–(d) at least one additional time.

30. A computer-readable medium having computer-executable instructions for performing the method of claim 29.

31. A computer-readable medium having computer-executable instructions, comprising:

determining a substate, the substate comprising a node string that is common in at least two states of a set of states of node strings arranged for storing in a trie;

selecting as selected states at least two states having the substate therein;

ordering each selected state such that the substate is at the end thereof;

configuring a pointer in a preceding node string that directly precedes the substate in at least one selected state to point to the substate in another selected state; and removing the substate that follows the preceding node string.

32. The computer-executable instructions of claim 31 further comprising, arranging the states of node strings in an array such that lower states follow a top-level state, determining whether any node string in the array has a right pointer that points to another node string that directly follows it in the array, and if so, removing that pointer and reclaiming at least some storage space allocated for that pointer.

33. The computer-executable instructions of claim 31 wherein selecting at least two states of selected node strings comprises, evaluating the node strings in a set of states to determine the substate by comparing the evaluated node strings against selection criteria for substates.

34. The computer-executable instructions of claim 33 wherein evaluating the node strings includes determining a frequency of occurrence of node strings that are common among the set of states.

* * * * *

UNITED STATES PATENT AND TRADEMARK OFFICE
CERTIFICATE OF CORRECTION

PATENT NO. : 6,298,321 B1
DATED : October 2, 2001
INVENTOR(S) : Karlov et al.

Page 1 of 1

It is certified that error appears in the above-identified patent and that said Letters Patent is hereby corrected as shown below:

Column 2,
Line 6, " "we't," " should read -- "we't'," --.

Column 5,
Line 46, "the node is the last in a state depends" should read -- the node that is the last in a state depends --.

Column 6,
Line 57, "DEA state" should read -- "DEA" state --.

Column 7,
Lines 34-35, "assume that at this time the threshold" should read -- assume that at this time the threshold --.

Column 9,
Line 32, "strings the identical" should read -- string as the identical --.

Column 10,
Line 26, "another to and a" should read -- another to find a --.

Column 11,
Line 11, "and pointing, to" should read -- and pointing to --.

Signed and Sealed this

Twelfth Day of October, 2004

JON W. DUDAS
*Director of the United States Patent and Trademark Office*